US009564415B2

(12) United States Patent
Harper

(10) Patent No.: US 9,564,415 B2
(45) Date of Patent: Feb. 7, 2017

(54) SEMICONDUCTOR PACKAGE DEVICE HAVING PASSIVE ENERGY COMPONENTS

(75) Inventor: Peter R. Harper, Gilroy, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 0 days.

(21) Appl. No.: 13/618,116

(22) Filed: Sep. 14, 2012

(65) Prior Publication Data

US 2014/0077385 A1    Mar. 20, 2014

(51) Int. Cl.
*H01L 23/48* (2006.01)
*H01L 23/00* (2006.01)
(Continued)

(52) U.S. Cl.
CPC ............ *H01L 24/94* (2013.01); *H01L 23/16* (2013.01); *H01L 24/17* (2013.01); *H01L 24/81* (2013.01); *H01L 25/16* (2013.01); *H01L 23/3128* (2013.01); *H01L 23/481* (2013.01); *H01L 24/13* (2013.01); *H01L 2224/02372* (2013.01); *H01L 2224/0401* (2013.01); *H01L 2224/0557* (2013.01); *H01L 2224/05548* (2013.01); *H01L 2224/05567* (2013.01); *H01L 2224/06181* (2013.01); *H01L 2224/131* (2013.01); *H01L 2224/13025* (2013.01); *H01L 2224/16265* (2013.01); *H01L 2224/1703* (2013.01); *H01L 2224/17181* (2013.01); *H01L 2224/17505* (2013.01); *H01L 2224/32265* (2013.01); *H01L 2224/73204* (2013.01);
(Continued)

(58) Field of Classification Search
CPC ............ H01L 23/49827; H01L 21/486; H01L 2224/16; H01L 25/0655; H01L 21/76898; H01L 2924/19011; H05K 1/185; H05K 3/34

USPC ................................. 257/724, 774
See application file for complete search history.

(56) References Cited

U.S. PATENT DOCUMENTS 6,184,062 B1 * 2/2001 Brofman ............... H01L 24/11
257/738
2008/0179758 A1 * 7/2008 Wong et al. ............... 257/778
(Continued)

OTHER PUBLICATIONS

Finkbeiner, F. M., C. Adams, E. Apodaca, J.A. Chervenak, J. Fischer, N. Doan, M.J. Li, C.K. Stahle, R.P. Brekosky, S.R. Bandler, E. Figueroa-Feliciano, M.A. Lindeman, R.L. Kelley, T. Saab, D.J. Talley "Development of ultra-low impedance Through-wafer Micro-vias" Nuclear Instruments and Methods in Physics Research A. vol. 520, 2004, 463-465.*

*Primary Examiner* — Lex Malsawma
*Assistant Examiner* — Laura Dykes
(74) *Attorney, Agent, or Firm* — Advent, LLP

(57) ABSTRACT

A semiconductor package device is disclosed that includes a passive energy component integrated therein. In an implementation, the semiconductor package device includes a semiconductor substrate having a first surface and a second surface. The semiconductor substrate includes one or more integrated circuits formed proximal to the first surface. The semiconductor package device also includes a passive energy component positioned over the second surface. The passive energy component is electrically connected to one or more integrated circuits. The semiconductor package device also includes an encapsulation structure disposed over the second surface and at least substantially encapsulates the passive energy component.

13 Claims, 6 Drawing Sheets

(51) Int. Cl.
*H01L 23/16* (2006.01)
*H01L 25/16* (2006.01)
*H01L 23/31* (2006.01)

(52) U.S. Cl.
CPC ............. *H01L 2224/81191* (2013.01); *H01L 2224/81192* (2013.01); *H01L 2224/81986* (2013.01); *H01L 2224/94* (2013.01); *H01L 2924/00014* (2013.01); *H01L 2924/15311* (2013.01); *H01L 2924/181* (2013.01); *H01L 2924/19041* (2013.01); *H01L 2924/19042* (2013.01); *H01L 2924/19043* (2013.01); *H01L 2924/19104* (2013.01)

(56) References Cited

U.S. PATENT DOCUMENTS

| | | | |
|---|---|---|---|
| 2010/0164079 A1* | 7/2010 | Dekker et al. | 257/676 |
| 2010/0207266 A1* | 8/2010 | Chang et al. | 257/692 |
| 2011/0120758 A1* | 5/2011 | Lee | H01L 24/11 174/257 |
| 2011/0254160 A1* | 10/2011 | Tsai et al. | 257/738 |
| 2013/0119538 A1* | 5/2013 | McCarthy | 257/738 |

\* cited by examiner

SEMICONDUCTOR PACKAGE DEVICE HAVING PASSIVE ENERGY COMPONENTS

BACKGROUND

Traditional fabrication processes used in the manufacture of semiconductor devices employ microlithography to pattern integrated circuits onto a circular wafer formed of a semiconductor such as silicon, gallium arsenide, and so forth. Typically, the patterned wafers are segmented into individual integrated circuit chips or dies to separate the integrated circuits from one another. The individual integrated circuit chips are assembled or packaged using a variety of packaging technologies to form semiconductor devices that may be mounted to a printed circuit board.

Over the years, packaging technologies have evolved to develop smaller, cheaper, more reliable, and more environmentally-friendly packages. For example, chip-scale packaging technologies have been developed that employ direct surface mountable packages having a surface area that is not substantially greater than (e.g. is no greater than 1.2 times) the area of the integrated circuit chip. Wafer-level packaging (WLP) is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

SUMMARY

A semiconductor package device that includes a passive energy component is disclosed. In an implementation, the semiconductor package device includes a semiconductor substrate having a first surface and a second surface. The semiconductor substrate includes one or more integrated circuits formed proximal to (e.g., adjacent to, in, or on) the first surface. The semiconductor package device also includes a passive energy component positioned over the second surface. In one or more implementations, the semiconductor package device includes a through-substrate via that furnishes an electrical connection to the passive energy component. The semiconductor package device also includes an encapsulation structure disposed over the second surface and at least substantially encapsulates the passive energy component.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

DETAILED DESCRIPTION

Overview

Integrated circuit systems, such as power management integrated circuit (PMIC) systems, generally require passive energy components, such as inductors and/or capacitors, to complete the system. In current IC designs, the passive energy components are external to the power management integrated circuits, which requires additional area on the printed circuit board (PCB). Additionally, the external passive energy components result in added parasitic RLC values that degrade the performance of the system. The external passive components may also require an additional pin to the IC die for an external sense line connection.

Accordingly, a semiconductor package device is disclosed that includes one or more passive energy components packaged therein. In an implementation, the semiconductor package device includes a semiconductor substrate having a first surface and a second surface. The semiconductor substrate includes a one or more integrated circuits formed proximal (e.g., adjacent to, in, or on) to the first surface. The semiconductor package device also includes one or more passive energy components positioned over the second surface. For example, the passive energy components may be surface-mounted the second surface. Example passive energy components may include, but are not necessarily limited to: may comprise a capacitor, an inductor, a resistor, and so forth. For example, in an implementation, the semiconductor package device includes a through-substrate via (TSV), such as a micro TSV (µTSV), that provides for an internal electrical connection between the passive energy component and the integrated circuits. The semiconductor package device also includes an encapsulation structure disposed over the second surface and at least substantially encapsulates the passive energy component By integrating the passive energy component within the semiconductor package device, the RLC values may be reduced as compared to externally located passive energy components.

Example Implementations

Figure 1A:
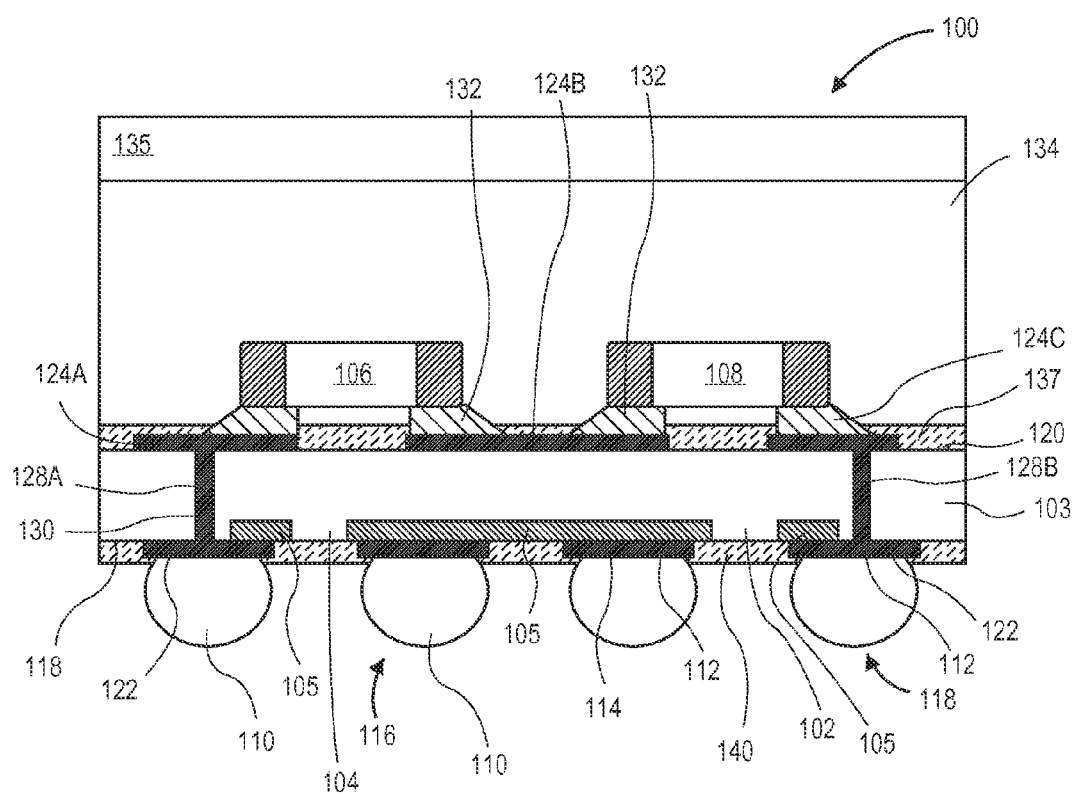
FIG. 1A is a diagrammatic partial cross-sectional side elevation view illustrating a wafer-level semiconductor package device in accordance with an example implementation of the present disclosure, where the semiconductor package device includes multiple passive energy components packaged therein.
Figure 1B:
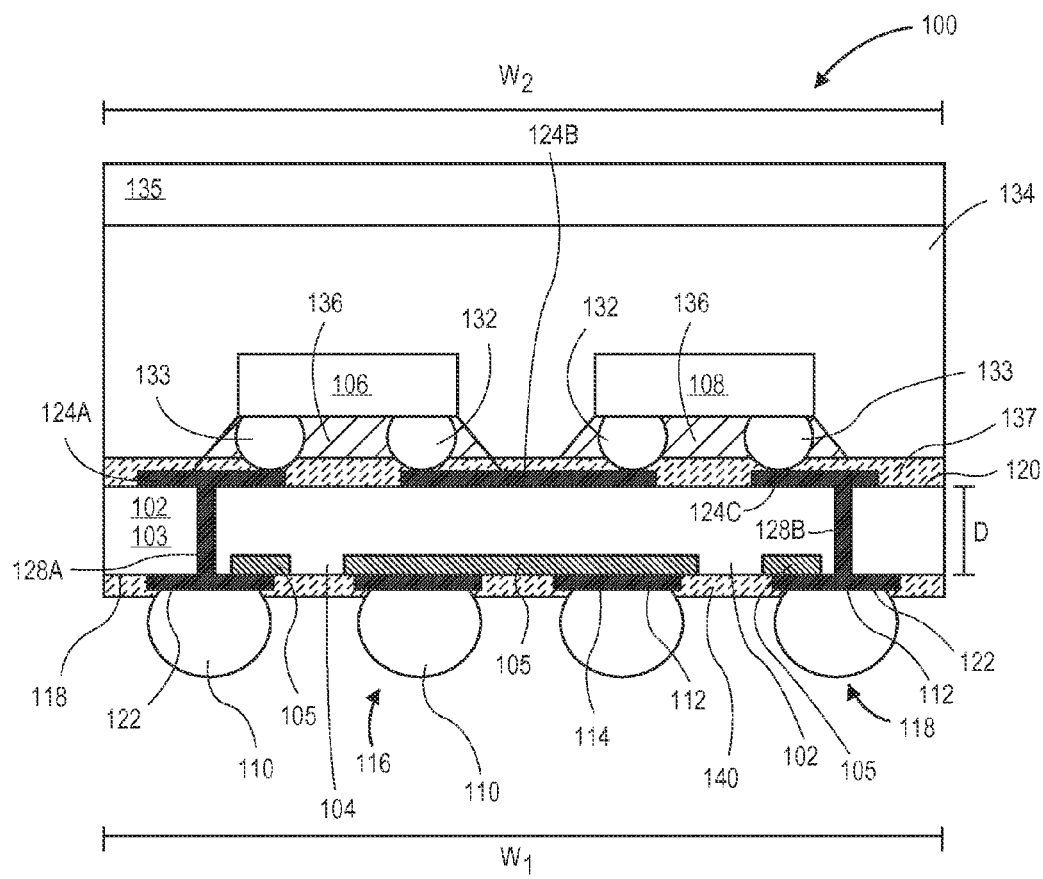
FIG. 1B is a diagrammatic partial cross-sectional side elevation view illustrating a wafer-level package device in accordance with another example implementation of the present disclosure.
Figure 1C:
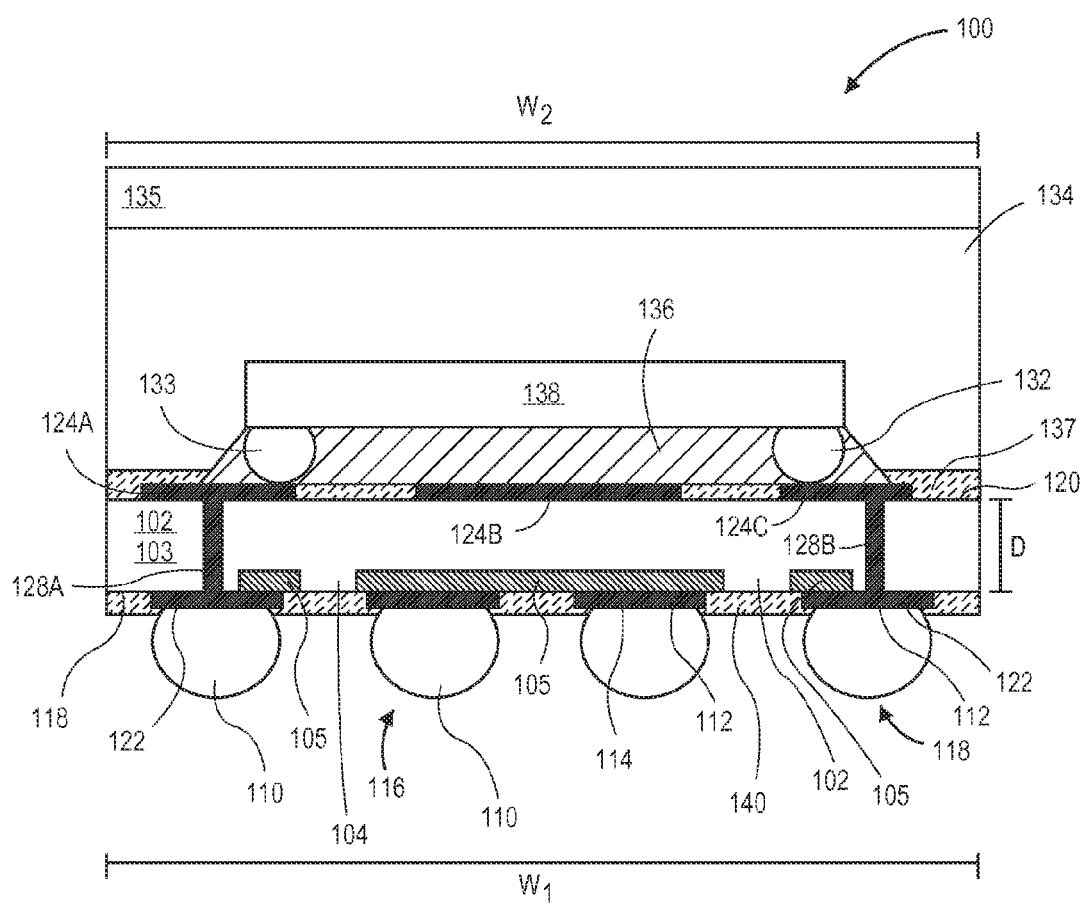
FIG. 1C is a diagrammatic partial cross-sectional side elevation view illustrating a wafer-level package device in accordance with another example implementation of the present disclosure.

FIGS. 1A through 1C illustrate wafer-level package (WLP) devices that include one or more passive energy components (e.g., capacitors, inductors, resisters, etc.) that are connected to one or more integrated circuit dies by way of a through-substrate via (TSV) formed in the dies. In an implementation, the integrated circuit die may comprise one or more power management integrated circuits (PMICs)

configured to provide power management functionality to one or more host systems. In another implementation, the integrated circuit die may be a radio-frequency (RF) integrated circuit die, or the like.

Referring now to FIGS. 1A through 1C, a wafer-level semiconductor package device 100 is described. The wafer-level package device 100 includes one or more dies (e.g., integrated circuit chip) 102 formed within a semiconductor substrate 103, such as a portion of a wafer 104. As described above, the die 102 includes integrated circuits 105 configured to furnish functionality to one or more host systems, and the like. In implementations, the integrated circuits may be comprised of digital circuitry, analog circuitry, memory circuitry, combinations thereof, and so forth. The integrated circuits 105 may be connected to one or more conductive layers, such as contact pads, redistribution layers (RDLs) or the like, deployed over the die 102. These conductive layers provide electrical contacts through which the integrated circuits are interconnected to other components associated with the device 100 (e.g., printed circuit boards, etc.). The number and configuration of conductive layers (e.g., contact pads) may vary depending on the complexity and configuration of the integrated circuits, the size and shape of the die 102, and so forth.

As used herein, the term "semiconductor substrate" refers to substrates constructed of materials such as, but not limited to: silicon, silicon dioxide, aluminum oxide, sapphire, germanium, gallium arsenide (GaAs), alloys of silicon and germanium, and/or indium phosphide (InP). Further, for the purposes of the present disclosure, a semiconductor substrate can be formed as a semiconductor or an electrical insulator, and may include layers of both semiconducting and insulating material. For example, in implementations, a semiconductor substrate can be formed using an insulator, such as silicon oxide, with a layer of semiconducting material, such as silicon formed thereupon. Electrical components, such as transistors and diodes, can be fabricated in the semiconductor. In other implementations, the semiconductor substrate can be formed as an insulator, a dielectric, and so forth.

The wafer-level package device 100 also includes one or more passive energy components (passive energy components 106, 108 shown in FIGS. 1A through 1C). In one or more implementations, the passive energy components 106, 108 comprise an inductor, a capacitor, and/or a resistor. While FIGS. 1A through 1C illustrate passive energy component 106 referencing an inductor and passive energy component 108 referencing a capacitor, it is understood that the passive energy components 106, 108 may be interchanged. In a specific implementation, the passive energy components 106, 108 comprise surface-mount (SMT) energy components.

As shown in FIGS. 1A through 1C, the wafer-level package device 100 includes a plurality of attachment bumps 110. The attachment bumps 110 comprise solder bumps that furnish mechanical and/or electrical interconnection between the contact pads deployed over the die 102 and corresponding pads formed on the surface of a printed circuit board. In one or more implementations, the attachment bumps 110 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used. Example processes for forming the attachment bumps 110 using wafer-level packaging techniques are described in more detail below.

Bump interfaces 112 may be applied to the contact pads of the die 102 to provide a reliable interconnect boundary between the contact pads and the attachment bumps 110. For instance, in the wafer-level package device 100 shown in FIGS. 1A through 1C, the bump interface 112 comprise pad (e.g., redistribution) structures 114 applied to the contact pads of the integrated circuit chip 102. The pad structures 114 may have a variety of compositions. For example, the pad structures 114 may include multiple layers of different metals (e.g., Aluminum (Al), Nickel (Ni), Copper (Cu), Vanadium (V), Titanium (Ti) etc.) that function as an adhesion layer, a diffusion barrier layer, a solderable layer, an oxidation barrier layer, and so forth. However, other pillar structures are possible. In another implementation, the bump interfaces 112 may comprise under-ball metallization structures.

Viewed together, the attachment bumps 110 and associated bump interfaces 112 (e.g., pad structure 114) comprise bump assemblies 116 that are configured to provide mechanical and/or electrical interconnection of the die 102 to the printed circuit board. As illustrated in FIGS. 1A through 1C, the wafer-level package devices 100 may include one or more arrays 118 of bump assemblies 116 depending on various design considerations.

It is contemplated that the die (integrated circuit chip) 102 may include active circuitry (integrated circuits 105) proximate (e.g., adjacent) to front side, or the surface 118, of the die 102. The front side is considered the surface 118 proximal to the bump assemblies 116 (e.g., distal to the passive energy components 106, 108). Thus, the surface 120 is considered the passive surface, or back side, (e.g., no active circuitry) of the die 102. The wafer-level package device 100 also includes one or more front side redistribution layers 122 deployed over the surface 118 (e.g., front side) and one or more back side redistribution layers 124 deployed over the surface 120 (e.g., back side). In this implementation, the redistribution layers 122 comprise the pad structures 114. However, it is understood that other configurations are possible (e.g., redistribution layers 122 and the pad structures 114 are distinct layers) according to the requirements of the devices 100. The redistribution layers 122, 124 include redistribution structure comprised of a thin-film metal (e.g., aluminum, copper) rerouting and interconnection system that redistributes the contact pads to an area array of electrical interfaces (e.g., bump interfaces 112, electrical interfaces 132, which are described in greater detail herein).

As shown, the passive energy components 106, 108 are positioned over the surface 118 and electrically connected to the back side redistribution layers 124 (e.g., redistribution layers 124A, 124B, 124C). One or more of the back side redistribution layers 124 are electrically connected to one or more front side redistribution layers 122. In an implementation, the front side redistribution layers 122 (e.g., front side redistribution layers 122A, 122B) provide an electrical connection to the contact pads of the die 102, as well as to one or more bump assemblies 116. In a specific implementation, as shown in FIGS. 1A to 1C, the backside redistribution layers 124A, 124C are electrically connected to the front side redistribution layers 122A, 122B, respectively, by way of through-substrate vias (TSVs) 128 (TSVs 128A, 128B). In a specific implementation, the TSVs 128 may comprise micro-TSV structures. The TSVs 128 extend at least substantially through the substrate 103 (e.g., extends at least substantially the depth (D) of the substrate 103). In one or more implementations, the TSVs 128 have an aspect ratio of at least approximately 1:1 to at least approximately 10:1.

The TSVs 128 include a conductive material 130, such as copper, poly-silicon, or the like, deposited therein. In a specific implementation, the TSVs 128 may have an approximate size ranging from about fifty micrometers (50 um) to about five micrometers (5 um) and an approximate depth ranging from about fifty micrometers (50 um) to about one hundred micrometers (100 um).

The passive energy components 106, 108 are communicatively connected to the respective redistribution layers 124 (124A, 124B, 124C) by way of an electrical interface 132. As shown in FIGS. 1A through 1C, the electrical interfaces 132 may be configured in a variety of ways. For example, as shown in FIG. 1A, the electrical interface 132 may comprise an at least substantially non-spherical cross-sectional shape comprised of a solderable alloy, such as a tin-silver-copper (SnAgCu) alloy, a tin-lead (SnPb) alloy, or a tin-antimony (Sn—Sb) alloy. In a specific implementation, the electrical interface 132 comprises a surface-mount pad for connecting the passive energy component 106, 108 to the corresponding redistribution layer 124. For instance, the surface-mount pad can have a generally trapezoidal shaped cross-sectional shape. However, it is understood that other cross-sectional shapes may be utilized (e.g., rectangular, square, oval, elliptical, etc.). It is contemplated that the electrical interface 132 may have a higher melting point as compared to the melting point of the attachment bumps 110 to at least substantially prevent reflow of the electrical interface 132 when the attachment bumps 110 are subjected to a reflow process. As shown in FIG. 1A, a first electrical interface 132A connects the passive energy component 106 to the redistribution layer 124A; a second electrical interface 132B and a third electrical interface 132C connect the passive energy components 106, 108, respectively, to the redistribution structure 124B; and a fourth electrical interface 132D connects the passive energy component 108 to the redistribution layer 124D. Thus, the passive energy components 106, 108 are communicatively connected to the front side redistribution layers 122A, 122B (as well as the integrated circuits 105).

The device 100 further includes an encapsulation structure 134 that encapsulates, at least substantially, the passive energy components 106, 108 and is supported by the die 102. In one or more implementations, the encapsulation structure 134 is configured to provide mechanical and/or environmental protection to the passive energy components 106, 108. The encapsulation structure 134 may comprise a mold compound (e.g., an overmold), a ceramic material, plastic, an epoxy material, or the like. The width (W1) of the encapsulation structure 132 is at least approximately the width (W2) of the die 102. In an implementation, the mold compound at least substantially covers the passive energy components 106, 108. A mechanical stiffener assembly 135 may be used to provide mechanical strength and control flatness of the device 100. The stiffener assembly 135 may be comprised of a number of suitable materials, such as, but not limited to, a silicon material, an aluminum oxide (Al2O3) material, a ceramic material, or Alloy 42.

FIGS. 1B and 1C illustrate additional implementations of the present disclosure. As shown in FIG. 1B, the passive energy components 106, 108 may be formed within a portion of a wafer (e.g., passive energy components 106, 108 are formed within a die). In this implementation, the electrical interface 132 may comprise attachment bumps 133 that furnish an electrical connection between the passive energy components 106, 108 and the corresponding redistribution layers 124. As shown, an underfill 136 at least partially encapsulates the electrical interfaces 132 and serves to furnish mechanical support and/or environmental protection to the electrical interfaces 132. The underfill 136 may be deposited at least partially over a first protective layer 137 (e.g., dielectric material, etc.). In an implementation, the underfill 136 may be filled epoxy or another dielectric material. As shown in FIG. 1C, in another implementation, a semiconductor substrate 138 may be positioned over the surface 120 and electrically connected to the redistribution layer 124 by way of the electrical interfaces 132. As shown, the semiconductor substrate 138 is supported upon the underfill 136. In this implementation, the semiconductor substrate 138 comprises a monolithic passive energy component substrate (e.g., a passive die) that includes one or more of a resistor, an inductor, and/or a capacitor. Thus, multiple passive energy components (e.g., two of the three components, all three components) may be formed within the monolithic substrate. It is contemplated that a flip-chip process may be utilized to position the electrical interfaces 132 on the respective passive energy components (passive energy components 106, 108, monolithic semiconductor substrate having passive energy components formed therein) and then attaching the passive energy components to the back side redistribution layer 124. Additionally, as shown in FIGS. 1A through 1C, the wafer-level package device 100 may also include a second protective layer 140 deposited over the surface 118 (e.g., front side) to at least partially provide mechanical support to the attachment bumps 110. The second protective layer 140 may comprise multiple polymer layers that serve to function as a stress buffer during fabrication of the substrate 103.

Example Fabrication Process

Figure 2:
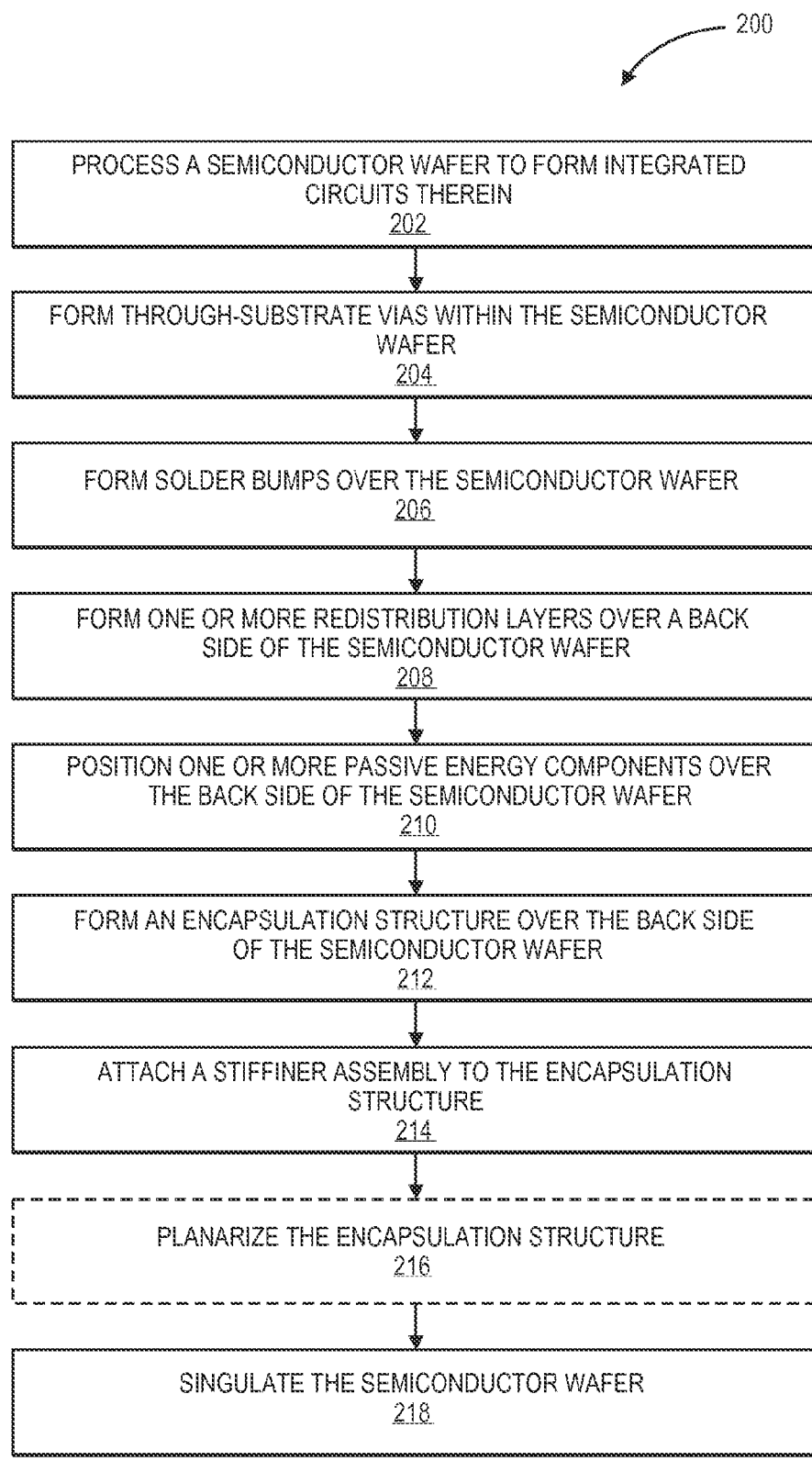
FIG. 2 is a flow diagram illustrating a process in an example implementation for fabricating wafer-level package devices in accordance with the present disclosure, such as the device shown in FIG. 1A.
Figure 3:
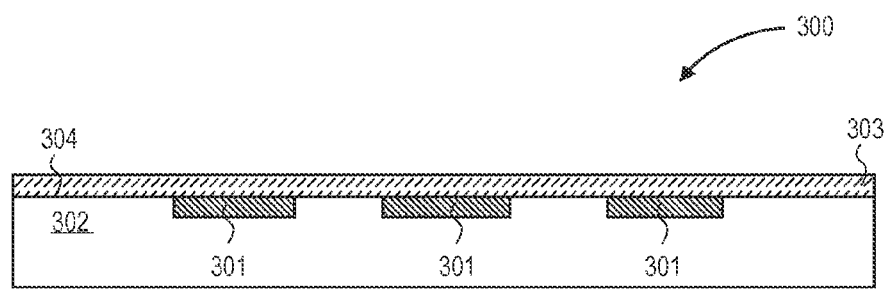
FIGS. 3 through 5 are diagrammatic partial cross-sectional side elevation views illustrating the fabrication of a wafer-level semiconductor package device, such as the device shown in FIG. 1A, in accordance with the process shown in FIG. 2.
Figure 4:
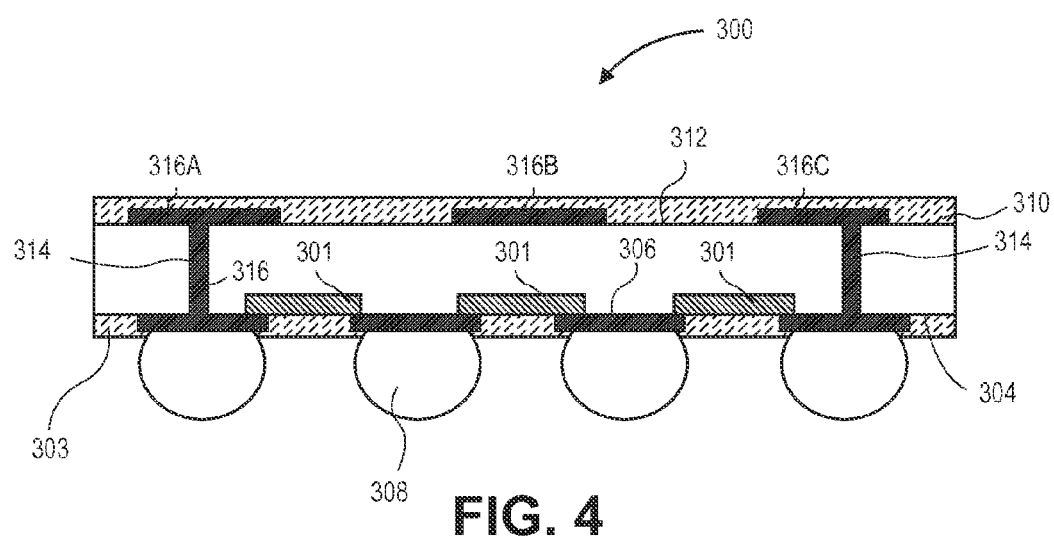
Figure 5:
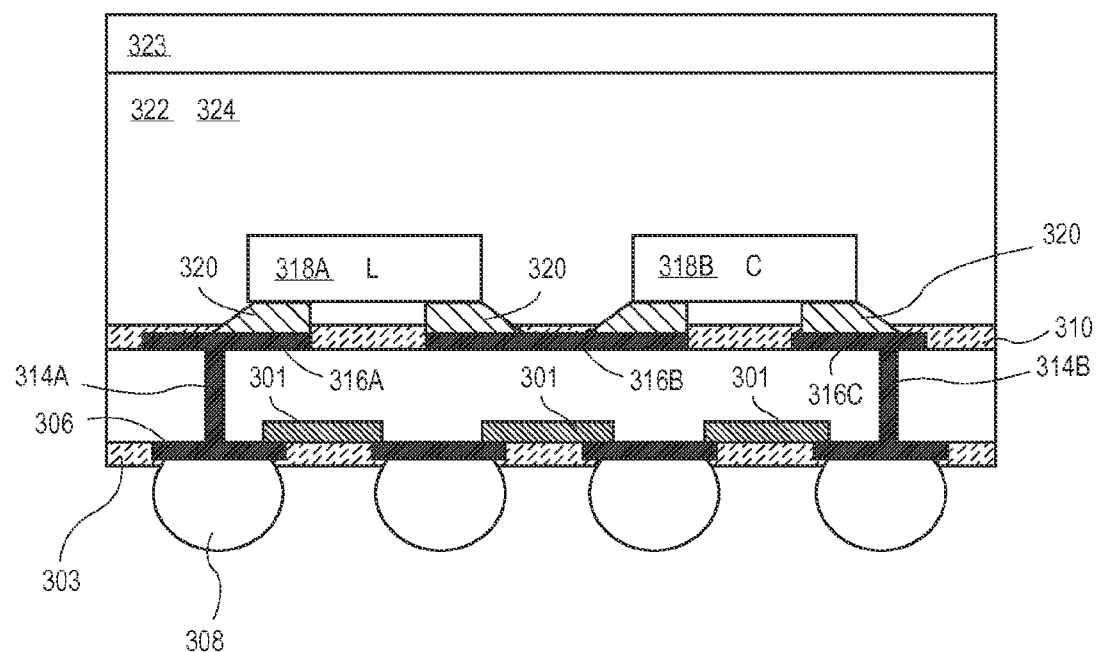

The following discussion describes example techniques for fabricating a semiconductor chip package including one or more surface-mounted (SMT) passive energy components packaged therein, where the chip package is formed in a wafer level packaging (WLP) process. FIG. 2 depicts a process 200, in an example implementation, for fabricating a semiconductor device, such as the example chip packages 100 illustrated in FIGS. 1A through 1C and described above. FIGS. 3 through 5 illustrate sections of example semiconductor wafers that are utilized to fabricate semiconductor devices 300 (such as device 100 shown in FIG. 1A). In the process 200 illustrated, a semiconductor wafer (e.g., substrate) is processed (Block 202) to form integrated circuits therein. The integrated circuits may be configured in a variety of ways. For example, the integrated circuits may be digital integrated circuits, analog integrated circuits, mixed-signal integrated circuits, memory circuits and so forth. In a specific example, the integrated circuits may be power management integrated circuits configured to manage battery requirements, regulate voltage, manage charging functions, and so forth. In one or more implementations, front-end-of-line techniques may be utilized to form the integrated circuits 301 in the semiconductor wafer, such as the wafer 302 illustrated in FIG. 3. Once the integrated circuits 301 are formed within the wafer 302, a protective layer (e.g., passivation layers, dielectric layers, etc.) 303 is formed over the wafer 302 to furnish protection to the integrated circuits during manufacturing and use. The protective layer 303 is formed over the front (e.g., active) side, or the surface 304, or the wafer 302.

Prior to formation of bump interfaces (bump interfaces 306 [e.g., solder bumps 308]), through-substrate vias are formed within the semiconductor wafer (Block 204). As shown in FIG. 5, a second protective layer 310 is formed (e.g., deposited) over the back (e.g., passive) side, or the surface 312, of the wafer 302. As shown, the wafer 302 has been flipped (e.g., a flip-chip process once the front side of the wafer 302 has been processed). The second protective layer 310 is then selectively etched to at least substantially remove portions of the protective layer 310. One or more micro-through-substrate (e.g., silicon) vias (TSVs) 314 are then formed within the semiconductor wafer and a conductive material 316 (e.g., copper, poly-silicon, etc.) deposited therein. Formation of the micro-TSVs 314 may include selective removing (via a suitable etching process) portions of the wafer 302 such that the TSVs 314 extend from the back side of the wafer 302 to the front side of the wafer 302. The TSVs 314 (314A, 314B) serve to provide electrical connectivity between the front side of the wafer and the back side of the wafer 302. The conductive material 316 may be deposited through suitable deposition processes, such as a copper damascene process, or the like. In a specific implementation, the micro-TSVs 314 may have an approximate size from about ten micrometers (10 um) to about twenty micrometers (20 um) and an approximate depth from about fifty micrometers (50 um) to about one hundred micrometers (100 um).

Once the protective layer is formed over the front side (surface) of the wafer, solder bumps are formed over the semiconductor wafer (Block 206). For example, solder balls are positioned over bump interfaces 306 (e.g., pillar structures, UBMs, front side redistribution layers) and reflowed to form solder bumps (e.g., attachment bumps) 308 (see FIG. 4). In an implementation, the protective layer 303 is selectively etched prior to placement and formation of the solder bumps.

One or more redistribution layers are formed over the back side of the semiconductor wafer (Block 208). As shown in FIG. 4, the redistribution layers 316A, 316B, 316C are deposited over the surface 312 of the wafer 302. Once the redistribution layers 316A, 316B, 316C are formed (deposited), the redistribution layers 316A, 316B, 316C may be selectively etched to prevent electrical crosstalk and/or electrical shorts. One or more passive energy components are positioned (e.g., surface-mounted) over and in contact with the back side of the semiconductor wafer (Block 210). As described above, the passive energy components may comprise capacitors, inductors, and/or resistors. As shown in FIG. 5, the passive energy components 318A, 318B are positioned over and in contact with the redistribution layers 316A, 316B, 316C. The passive energy components 318A, 318B are in electrical contact with the respective redistribution layers 316A, 316B, 316C by way of electrical interfaces 320 (SMT pads, solder bumps, etc.). As shown, the passive energy components 318A, 318B are in electrical communication with the front side (e.g., integrated circuits 301 of the wafer 302, etc.) by way of the redistribution layers 316A, 316B, 316C, the TSVs 314, and the attachment interfaces 306.

An encapsulation structure is then formed over the semiconductor wafer over the back side of the semiconductor wafer (Block 212). An encapsulation structure, for example, as shown in FIG. 5, the encapsulation structure 322 may comprise an overmold 324 (e.g., a mold compound). The mold compound may comprise a liquid or powder material, such as an epoxy material, a resin based material, and/or a thermoplastic elastomer material. For example, in a specific instance, an epoxy backbone can be used with a spherical silica filler material. The mold compound may be selected based upon characteristics including, but not limited to: Coefficient of Thermal Expansion (CTE), flex modulus, and/or particle size. Once the encapsulation structure is formed, a stiffener assembly is attached to the encapsulation structure (Block 214). As shown in FIG. 5, a stiffener assembly 323 is attached to the encapsulation structure 322 to provide additional strength and to control warpage of the structure 322. In some embodiments, a transfer molding process can be used with the mold compound. In an embodiment, a liquid mold compound may be used to form the overmold 324. In other embodiments, a compression molding process can be used with the mold compound. For example, a granular mold compound is placed in a compression mold cavity, pressure is applied to the mold compound, and then heat and pressure are maintained until the molding material has cured. It should be noted that the thickness of the mold compound may be selected to prevent or minimize the effects of pressure upon the passive energy components 318A, 318B. For example, when compression molding is used, the thickness of the mold compound can be selected to be greater than the height of the pillars passive energy components 318A, 318B. In some embodiments, planarization may be used to flatten the surface of the overmold (Block 216). Next, the semiconductor substrate may be singulated to provide individual integrated circuit devices (Block 218). For example, wafer 302 can be singulated to provide individual chip packages, such as chip packages 100, having passive energy components packaged therein, which may serve to reduce RLC impedance values (as compared to chip packages that are externally connected to passive energy components).

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor package device comprising:
   a semiconductor substrate having a first surface and a second surface, the semiconductor substrate including a plurality of integrated circuits formed proximate to the first surface and a plurality of attachment bumps disposed over the first surface, the semiconductor substrate having a first width;
   a first passive energy component disposed over the second surface, the first passive energy component including a first non-spherical surface-mount pad and a second non-spherical surface-mount pad, the plurality of attachment bumps having a first melting point and the non-spherical surface-mount pad having a second melting point, the second melting point higher than the first melting point, the non-spherical surface-mount pad having a generally trapezoidal cross-sectional shape;
   a second passive energy component disposed over the second surface, the second passive energy component including a first non-spherical surface-mount pad and a second non-spherical surface-mount pad, the plurality of attachment bumps having a first melting point and the non-spherical surface-mount pad having a second melting point, the second melting point higher than the first melting point, the second passive energy component different from the first passive energy component, the non-spherical surface-mount pad having a generally trapezoidal cross-sectional shape;
   a first micro through-substrate via at least substantially extending from the first surface to the second surface, the first micro through-substrate via configured to electrically connect the first passive energy component to a first integrated circuit of the plurality of integrated circuits and a second micro through-substrate via at least substantially extending from the first surface to the second surface, the second micro through-substrate via configured to electrically connect the second passive energy component to a second integrated circuit of the plurality of integrated circuits;

a first redistribution layer disposed over the second surface, the first redistribution layer configured to furnish an electrical connection between the first passive energy component and the first through-substrate via, the first passive energy component electrically connected to the first redistribution layer through the first non-spherical surface-mount pad of the first passive energy component;

a second redistribution layer disposed over the second surface, the second redistribution layer configured to furnish an electrical connection between the first passive energy component and the second energy component, the first passive energy component electrically connected to the second redistribution layer through the second non-spherical surface-mount pad of the first passive energy component and the second passive energy component electrically connected to the redistribution layer through the first non-spherical surface-mount pad of the second passive energy component;

a third redistribution layer disposed over the second surface, the third redistribution layer configured to furnish an electrical connection between the second passive energy component and the second through-substrate via, the second passive energy component electrically connected to the second redistribution layer through the second non-spherical surface-mount pad of the second passive energy component; and an encapsulation structure disposed over the second surface, the encapsulation structure at least substantially encapsulating the first passive energy component and the second passive energy component, the encapsulation structure having a second width, the second width corresponding to the first width, the encapsulation structure comprising a mold compound.

2. The semiconductor device as recited in claim 1, wherein the plurality of attachment bumps comprises a plurality of solder bumps.

3. The semiconductor device as recited in claim 1, wherein the first passive energy component comprises at least one of a capacitor, an inductor, or a resistor.

4. The semiconductor device as recited in claim 1, wherein the encapsulation structure is comprised of an overmold molded over the second surface of the semiconductor substrate.

5. The semiconductor device as recited in claim 1, further comprising a stiffener assembly disposed over the encapsulation structure to furnish mechanical strength to the encapsulation structure.

6. A wafer-level semiconductor package device comprising:

a semiconductor substrate having a first surface and a second surface, the semiconductor substrate including a plurality of power management integrated circuits formed proximate to the first surface and a plurality of attachment bumps disposed over the first surface, the semiconductor substrate having a first width;

a first passive energy component disposed over the second surface, the first passive energy component including a first non-spherical surface-mount pad and a second non-spherical surface-mount pad, the plurality of attachment bumps having a first melting point and the non-spherical surface-mount pad having a second melting point, the second melting point higher than the first melting point, the non-spherical surface-mount pad directed connected to the first passive energy component, the non-spherical surface-mount pad having a generally trapezoidal cross-sectional shape;

a second passive energy component disposed over the second surface, the second passive energy component including a first non-spherical surface-mount pad and a second non-spherical surface-mount pad, the plurality of attachment bumps having a first melting point and the non-spherical surface-mount pad having a second melting point, the second melting point higher than the first melting point, the second passive energy component different from the first passive energy component, the non-spherical surface-mount pad directed connected to the second passive energy component, the non-spherical surface-mount pad having a generally trapezoidal cross-sectional shape;

a discrete encapsulation structure disposed over the second surface, the discrete encapsulation structure at least substantially encapsulating the first passive energy component and the second passive energy component, the discrete encapsulation structure having a second width, the second width corresponding to the first width, the discrete encapsulation structure comprising a mold compound;

a first micro through-substrate via at least substantially extending from the first surface to the second surface, the first micro through-substrate via configured to electrically connect the first passive energy component to a first power management integrated circuit of the plurality of power management integrated circuits and a second micro through-substrate via at least substantially extending from the first surface to the second surface, the second micro through-substrate via configured to electrically connect the second passive energy component to a second power management integrated circuit of the plurality of power management integrated circuits, at least one of the first micro through-substrate via or the second through-substrate via having an aspect ratio ranging from 1:1 to 10:1;

a first redistribution layer disposed over the second surface, the first redistribution layer configured to furnish an electrical connection between the first passive energy component and the first through-substrate via, the first passive energy component electrically connected to the first redistribution layer through the first non-spherical surface-mount pad of the first passive energy component;

a second redistribution layer disposed over the second surface, the second redistribution layer configured to furnish an electrical connection between the first passive energy component and the second energy component, the first passive energy component electrically connected to the second redistribution layer through the second non-spherical surface-mount pad of the first passive energy component and the second passive energy component electrically connected to the redistribution layer through the first non-spherical surface-mount pad of the second passive energy component; and a third redistribution layer disposed over the second surface, the third redistribution layer configured to furnish an electrical connection between the second passive energy component and the second through-substrate via, the second passive energy component electrically connected to the second redistribution layer through the second non-spherical surface-mount pad of the second passive energy component.

7. The semiconductor device as recited in claim 6, further comprising a plurality of attachment bumps disposed over the first surface, wherein at least one of the plurality of attachment bumps is electrically connected to the first passive energy component by way of the first micro through-substrate via.

8. The semiconductor device as recited in claim 6, wherein the first passive energy component comprises a semiconductor substrate having at least one of a capacitor, an inductor, or a resistor formed therein.

9. A method of fabricating a wafer level package comprising:
processing a semiconductor wafer to form a plurality of integrated circuits therein, the semiconductor wafer having a first surface and a second surface, the plurality of integrated circuits proximal to the first surface, a portion of the semiconductor wafer defining a semiconductor substrate;
forming a first micro through-substrate via and a second micro through-substrate via in the semiconductor wafer, the first micro through-substrate via and the second micro through-substrate via extending at least substantially from the first surface to the second surface, at least one of the first micro through-substrate via or the second through-substrate via having an aspect ratio ranging from 1:1 to 10:1;
forming a first redistribution layer over the second surface;
forming a second redistribution layer over the second surface;
forming a third redistribution layer over the second surface
positioning a first passive energy component over the second surface, the first passive energy component electrically connected to a first integrated circuit of the plurality of integrated circuits by way of the first micro through-substrate via, the first passive energy component including a first non-spherical surface-mount pad and a second non-spherical surface-mount pad, the non-spherical surface-mount pad directly connected to the first passive energy component, the non-spherical surface-mount pad having a generally trapezoidal cross-sectional shape, the first non-spherical surface-mount pad directly connected to the first redistribution layer to electrically connect the first passive energy component to the first micro through-substrate via and the second non-spherical surface-mount pad directly connected to the second redistribution layer;
positioning a second passive energy component over the second surface, the second passive energy component electrically connected to a second integrated circuit of the plurality of integrated circuits by way of the second micro through-substrate via, the second passive energy component including a first non-spherical surface-mount pad and a second non-spherical surface-mount pad, the second passive energy component different from the first passive energy component, the non-spherical surface-mount pad directly connected to the second passive energy component, the non-spherical surface-mount pad having a generally trapezoidal cross-sectional shape, the first non-spherical surface-mount pad directly connected to the second redistribution layer to electrically connect the second passive energy component to the first passive energy component and the second non-spherical surface-mount pad directly connected to the third redistribution layer to electrically connect the second passive energy component to the second micro through-substrate via;
forming a plurality of attachment bumps over the first surface, the plurality of attachment bumps having a first melting point and the non-spherical surface-mount pad having a second melting point, the second melting point higher than the first melting point; and
forming an encapsulation structure over the second surface, the encapsulation structure at least substantially encapsulating the first passive energy component and the second passive energy component, the encapsulation structure having a width corresponding to a width of the semiconductor substrate, the encapsulation structure comprising a mold compound.

10. The method as recited in claim 9, wherein the encapsulation structure comprises an overmold molded over the second surface.

11. The method as recited in claim 9, further comprising attaching a stiffener assembly to the encapsulation structure.

12. The method as recited in claim 9, wherein the first passive energy component comprises at least one of a capacitor, an inductor, or a resistor.

13. The method as recited in claim 9, depositing a conductive material in the first micro through-substrate via and the second micro through-substrate via.

* * * * *